United States Patent
Maa et al.

(10) Patent No.: US 7,358,107 B2
(45) Date of Patent: Apr. 15, 2008

(54) METHOD OF FABRICATING A GERMANIUM PHOTO DETECTOR ON A HIGH QUALITY GERMANIUM EPITAXIAL OVERGROWTH LAYER

(75) Inventors: Jer-Shen Maa, Vancouver, WA (US);
Jong-Jan Lee, Camas, WA (US);
Sheng Teng Hsu, Camas, WA (US);
Douglas J. Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 359 days.

(21) Appl. No.: 11/260,955

(22) Filed: Oct. 27, 2005

(65) Prior Publication Data
US 2007/0099329 A1 May 3, 2007

(51) Int. Cl.
*H01L 21/00* (2006.01)

(52) U.S. Cl. .............. 438/57; 438/29; 438/59; 438/200

(58) Field of Classification Search ........... 438/200, 438/57
See application file for complete search history.

(56) References Cited

U.S. PATENT DOCUMENTS

2005/0205954 A1* 9/2005 King et al. ............. 257/431

OTHER PUBLICATIONS

Li et al., *Selective growth of germanium on Si (100) through vias of $SiO_2$ nanoplate using solid source molecular beam epitaxy*, Applied Physics Letters, vol. 83, No. 24, pp. 5032-5034 (2003).

Li et al., *Heteroepitaxy of high-quality Ge on Si by nanoscale Ge seeds grown through a thin layer of $SiO_2$*, Applied Physics Letters, vol. 85, No. 11, pp. 1928-1930 (2004).

Langdo et al., *High quality Ge on Si by epitaxial necking*, Applied Physics Letters, vol. 76, No. 25, pp. 3700-3702 (2000).

* cited by examiner

Primary Examiner—Kiesha Rose
Assistant Examiner—Eric W Jones

(57) ABSTRACT

A method of fabricating a germanium photo detector includes preparing a silicon substrate; depositing and planarizing a silicon oxide layer; forming contact holes in the silicon oxide layer which communicate with the underlying silicon substrate; growing an epitaxial germanium layer of a first type on the silicon oxide layer and in the contact holes; growing an intrinsic germanium layer on the epitaxial germanium layer and any exposed silicon oxide layer; growing a germanium layer of a second type on the intrinsic germanium layer and any exposed silicon oxide layer; depositing a layer of covering material take from the group of materials consisting of polysilicon, polysilicon-germanium and $In_2O_3$—$SnO_2$; and etching the covering material to form individual sensing elements.

14 Claims, 3 Drawing Sheets

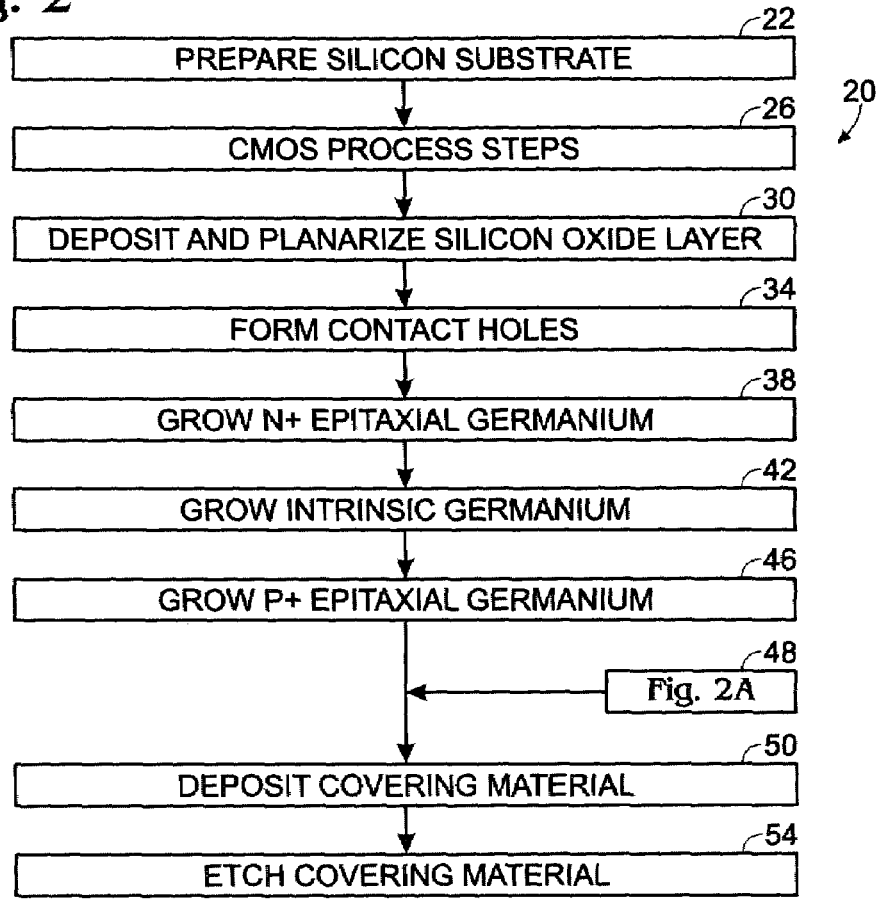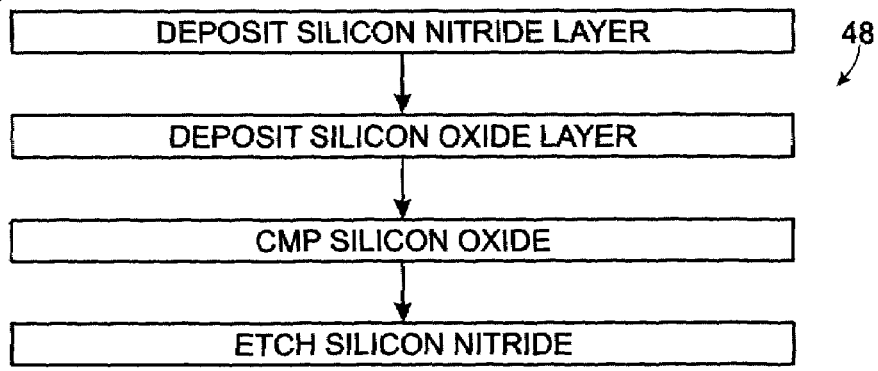

US 7,358,107 B2

METHOD OF FABRICATING A GERMANIUM PHOTO DETECTOR ON A HIGH QUALITY GERMANIUM EPITAXIAL OVERGROWTH LAYER

FIELD OF THE INVENTION

This invention relates to infra-red sensors, and specifically to a method for fabricating a germanium photodetector on a silicon wafer.

BACKGROUND OF THE INVENTION

Because of the lattice mismatch between a germanium lattice and a silicon lattice, epitaxial growth of germanium directly on a silicon wafer results in a high density of dislocations at the germanium/silicon interface. These dislocations adversely affect the electrical performance of germanium devices so fabricated. In order to reduce the dislocation at the germanium to silicon interface, a germanium epitaxial lateral overgrowth (ELO) technique has been developed.

Li et al. demonstrated that germanium may be selectively grown on silicon (100) through openings in a $SiO_2$ nanotemplate by solid source molecular beam epitaxy (MBE). Germanium islands grow in the template windows and coalesce on top of the template, forming an ELO layer. Cross sectional TEM images show that the germanium seeds and the ELO layer are free of threading dislocations. Stacking faults are generated, but terminate within 70 nm of the germanium-silicon interface, while twin-plane defects along {111} planes on either side of the germanium seed are observed in the ELO layer. Li et al., *Selective growth of germanium on Si (100) through vias of $SiO_2$ nanoplate using solid source molecular beam epitaxy*, Applied Physics Letters, Vol. 83, No. 24, pp 5032-5034 (2003); and Li et al., *Heteroepitaxy of high-quality Ge on Si by nanoscale Ge seeds grown through a thin layer of $SiO_2$*, Applied Physics Letters, Vol. 85, No. 11, pp 1928-1930 (2004).

Langdo et al. described selectively grown germanium on a $SiO_2$/Si substrate in 100 nm holes by chemical vapor deposition of high quality at the top surface, compared to conventional germanium lattice-mismatched grown on planar silicon substrates. The threading dislocation generated at the germanium/silicon interface are blocked at the oxide sidewall by the epitaxial necking mechanism. Defects at the germanium film surface only arise at the merging of epitaxial lateral overgrowth fronts from neighboring holes, Langdo et al., *High quality Ge on Si by epitaxial necking*, Applied Physics Letters, Vol. 76, No. 25, pp 3700-3702 (2000).

As shown in FIG. 1, a cross-section diagram of a germanium thin film 10 fabricated according to prior art processes on a silicon substrate 12 having a $SiO_2$ layer 14 thereon, exhibits epitaxial necking 16 having zero threading dislocations at the germanium film surface, however, twin-plane defects 18 are generated because of the merging of epitaxial lateral overgrowth fronts from neighboring holes. Although films may be fabricated using different growth methods, e.g., molecular beam epitaxy (MBE) and chemical vapor deposition (CVD), films fabricated by either method have a dislocation free epitaxial lateral overgrowth layer, but exhibit twin-plane defects, which are generated in the ELO layer because of the merging of ELO fronts from neighboring holes. Electrical characteristics of the germanium devices fabricated on an ELO-formed germanium layer do not exhibit electrical properties any better than devices fabricated on directly-grown germanium layers on silicon wafers. This is because that the twin-plane defects are a crystal defect that, electrically, behaves similar to a dislocation.

SUMMARY OF THE INVENTION

A method of fabricating a germanium photo detector includes preparing a silicon substrate; depositing and planarizing a silicon oxide layer; forming contact holes in the silicon oxide layer which communicate with the underlying silicon substrate; growing an epitaxial germanium layer of a first type on the silicon oxide layer and in the contact holes; growing an intrinsic germanium layer on the epitaxial germanium layer and any exposed silicon oxide layer; growing a germanium layer of a second type on the intrinsic germanium layer and any exposed silicon oxide layer; depositing a layer of covering material take from the group of materials consisting of polysilicon, polysilicon-germanium and $In_2O_3$—$SnO_2$; and etching the covering material to form individual sensing elements.

It is an object of the invention to us a germanium ELO process to grow a defect free ELO layer.

Another object of the invention is to limit the ELO process that no coalescing occurs to the adjacent ELO front.

A further object of the invention is to use the doping technique to make the dislocation away from the electrically active layer.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 2 is a block diagram of the method of the invention.

DETAILED DESCRIPTION OF THE PREFERRED EMBODIMENTS

The method of the invention results in the fabrication of a germanium photo detector structure which is twin-plane defect free, and wherein dislocations do not affect device electrical performance. The method of the invention uses a germanium epitaxial lateral overgrowth (ELO) process to grow a defect free ELO layer; limits the ELO process so that no coalescing occurs to any adjacent ELO front; and uses a doping technique to restrict any dislocations away from the electrically active layer.

Figure 1:
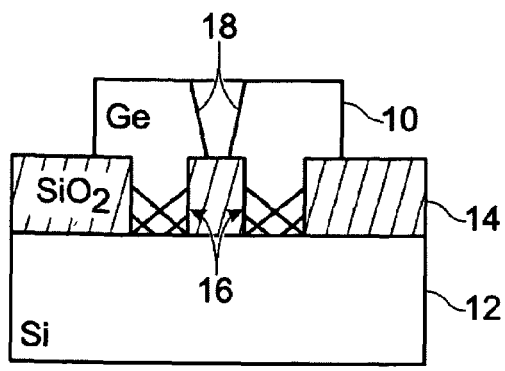
FIG. 1 is a cross-section diagram demonstrating prior art principles of epitaxial necking showing zero threading dislocations at the germanium film surface.
Figure 3:
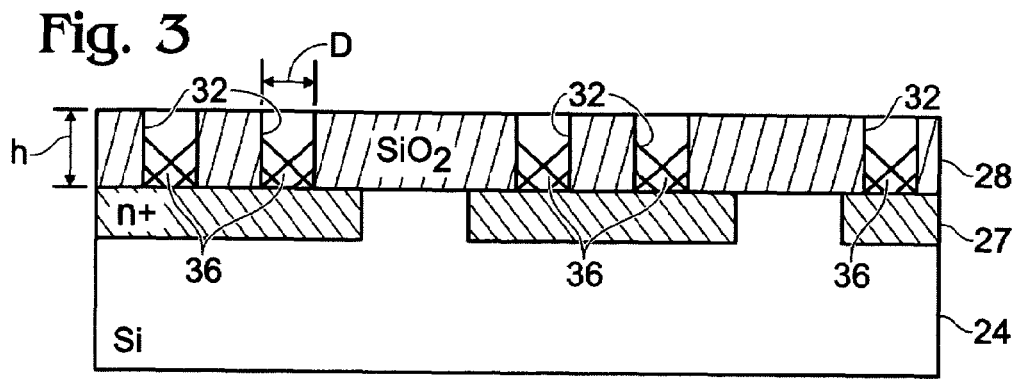
FIG. 3 depicts formation of contact holes and in situ growth of doped N+ germanium epi to fill the contact holes.

The process steps to make a germanium P-I-N photodetector on a germanium ELO layer, according to the method of the invention 20, and now referring to FIGS. 2 and 3, begins with preparation 22 of a silicon wafer 24. A silicon CMOS device may be processed prior to germanium device fabrication, therefore, a germanium photodetector integrated with a silicon CMOS process may be fabricated. In the example of the method of the invention described herein, silicon CMOS process step are only briefly described in the interest of brevity. CMOS process steps 26 include ion implantation to form a bottom electrode of the photodiode, which is a N+ layer 27 in the example. A layer of $SiO_2$ 28 is deposited and planarized 30 by chemical mechanical polishing (CMP). Contact holes 32 are formed 34 in the $SiO_2$ layer. Assuming an oxide thickness of "h" and a diameter of the contact hole of "D", the ratio of h/D is generally higher than "1", and may be as high as "5", so that the necking mechanism can terminate the dislocation on the oxide sidewall. With a h/D ratio of "1", the contact holes are approximately half filled. However, experimental data during development of the method of the invention demonstrated that a h/D ratio of 0.5 may effectively terminate the dislocation.

After contact hole formation, selective in-situ N+ epitaxial germanium, germanium of a first type, 36 is grown 38 into contact holes 32. The thickness of this N+ layer is more than the 0.5 times that of the diameter of the contact hole. Although in-situ N+ germanium is preferred at this step, as shown in FIG. 3, selective growth of intrinsic germanium, followed by N+ ion implantation and activation may also be suitable.

Figure 4:
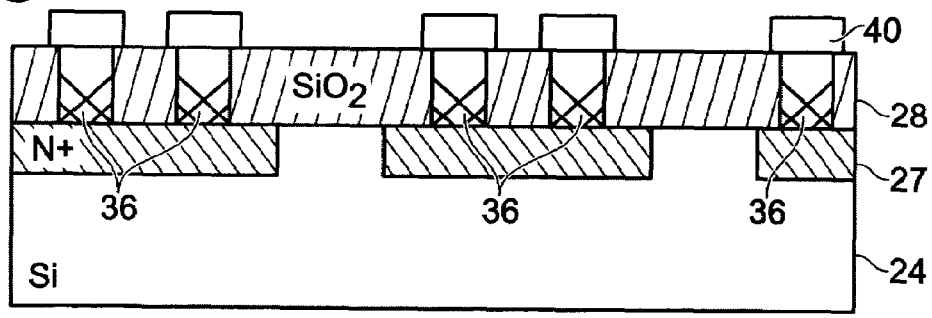
FIG. 4 depicts growth of intrinsic germanium by epitaxial lateral overgrowth.
Figure 5:
FIG. 5 is a SEM photo of ELO germanium grown according to the method of the invention.

Intrinsic germanium 40 is grown 42, as shown in FIG. 4, to finish filling the contact holes and over-grow the edge by ELO. The intrinsic germanium thickness is between about 100 nm to 2000 nm. The distance between two contact holes is selected to be more than twice the ELO layer thickness, so that the neighboring ELO growth fronts do not merge. FIG. 5 is a SEM image of germanium ELO, which clearly demonstrates the separation of growth fronts.

Figure 6:
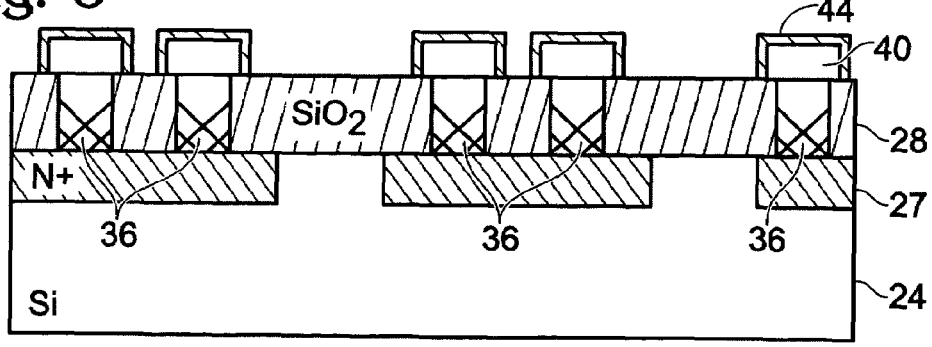
FIG. 6 depicts growth of P+ germanium by epitaxial lateral overgrowth.

Next, a P+ germanium, germanium of a second type, layer 44 is grown 46 by continued ELO, as shown in FIG. 6. Because germanium formed by ELO exhibits many facets, as shown in FIG. 5, an in-situ boron doped germanium layer is preferred to be used in this step. The P+ germanium layer thickness is between about 30 nm to 300 nm. It is preferred to have a thinner P+ germanium layer to allow most of the impinged light to be absorbed in the intrinsic layer. Although in-situ P+ doped germanium ELO growth is preferred at this step, P+ ion implantation followed by activation on the intrinsic ELO germanium layer is also suitable. The ion implantation may be performed by convectional ion implantation, or by a plasma immersion technique. The latter technique can implant the ion uniformly regardless the germanium shape.

At this point in the method of the invention, an optional planarization process 48 may be preformed. A thin layer of nitride is deposited followed by deposition of a layer of silicon oxide, to a thickness about 1.5 times that of the thickness of the germanium on $SiO_2$, followed by CMP, stopping at the level of the nitride, which results in a very smooth surface. After the nitride is etched, the method of the invention continues.

Figure 7:
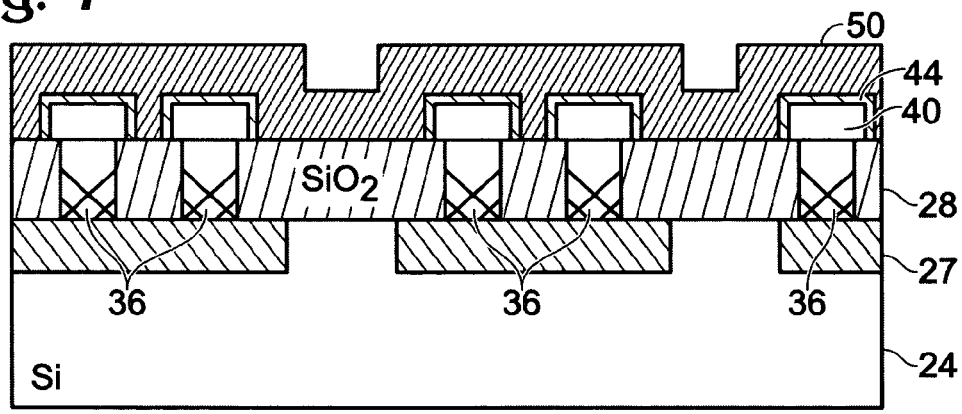
FIG. 7 depicts P+ polysilicon or ITO deposition over the fabricated structure.

A layer of P+ polysilicon, P+, polysilicon-germanium, or $In_2O_3$—$SnO_2$ (ITO), 50 is deposited 52 to cover the wafer, as shown in FIG. 7. This is not a selective deposition process. For a germanium IR detector, e.g., having a wavelength sensitivity greater than 1000 nm, P+ polysilicon may be used for this layer because P+ polysilicon is IR transparent. However, for light detection of light having a wavelength less than 1000 nm, ITO film is preferred. Again, the P+ polysilicon or P+, polysilicon-germanium can be in situ doped polysilicon or polysilicon-germanium, or formed by ion implantation of intrinsic polysilicon or polysilicon-germanium.

Figure 8:
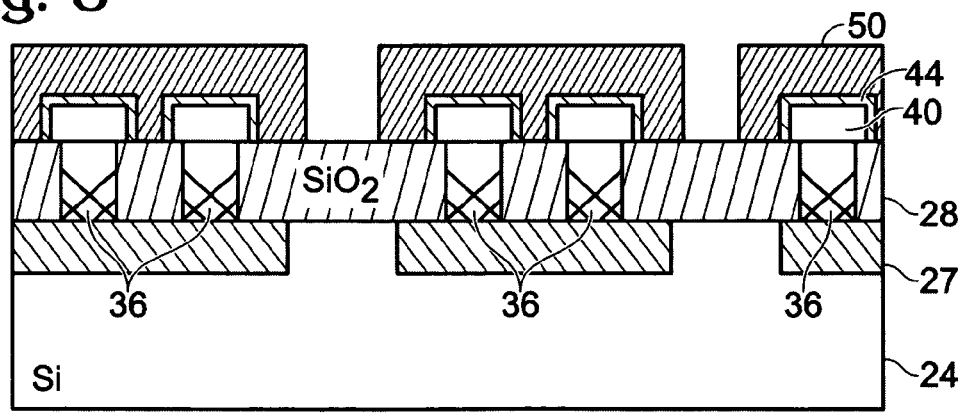
FIG. 8 depicts etching of the P+ polysilicon or ITO layer to define the pixel.

Finally, the P+ polysilicon or ITO layer is etched 54, as shown in FIG. 8, to define pixels. The size of sensing elements is defined in this step, and not by the size of germanium ELO. After defining the sensing element, the electrical connection between the sensing element and control circuit is followed and device fabrication is completed according to state-of-the-art processes The above stated process flow is for P-I-N germanium photodiodes fabrication. The same process can be used to fabricate N-I-P germanium photodiodes simply changing the n-doped and p-doped layers to p-doped and n-doped layers, respectively.

As shown in the drawings and as described in this Specification, the description includes all steps of the best mode of practicing the invention. There are no additional steps, and the various layers, as described, are formed and/or deposited in sequence without any intervening steps or layers.

Thus, a method for fabricating a germanium photodetector has been disclosed. It will be appreciated that further variations and modifications thereof may be made within the scope of the invention as defined in the appended claims.

We claim:

1. A method of fabricating a germanium photo detector comprising:
   preparing a silicon substrate;
   depositing and planarizing a silicon oxide layer;
   forming contact holes in the silicon oxide layer which communicate with the underlying silicon substrate;
   growing an epitaxial germanium layer of a first type on the silicon oxide layer and in the contact holes;
   growing an intrinsic germanium layer on the epitaxial germanium layer and any exposed silicon oxide layer;
   growing a germanium layer of a second type on the intrinsic germanium layer and any exposed silicon oxide layer;
   depositing a layer of covering material take from the group of materials consisting of polysilicon, polysilicon-germanium and $In_2O_3$—$SnO_2$; and
   etching the covering material to form individual sensing elements.

2. The method of claim 1 which includes, after said preparing a silicon substrate; performing any CMOS process steps, including, implanting ions in the silicon substrate to from a N+ layer for a bottom electrode of a photodiode; and wherein said forming contact holes in the silicon oxide layer which communicate with the underlying silicon substrate includes forming contact holes which communicate with the N+ layer.

3. The method of claim 1 which includes forming contact holes of diameter "D" and wherein said growing an epitaxial germanium layer of a first type on the silicon oxide layer and in the contact holes includes growing an epitaxial germanium layer to a thickness "H", wherein the h:D ration is between about 0.5 and 5.

4. The method of claim 1 wherein germanium of a first type is N+ germanium and germanium of a second type is P+ germanium.

5. The method of claim 1 wherein said growing an intrinsic germanium layer on the epitaxial germanium layer and any exposed silicon oxide layer includes growing intrinsic germanium to a thickness of between about 100 nm to 2000 nm, and wherein the distance between the contact holes is more than twice the thickness of the intrinsic germanium layer.

6. The method of claim 1 which further includes, after said growing a germanium layer of a second type on the intrinsic germanium layer and any exposed silicon oxide layer, depositing a layer of silicon nitride; depositing a layer of silicon oxide on the silicon nitride; polishing the structure to remove the silicon oxide, stopping at the level of the silicon nitride; and etching to remove the silicon nitride.

7. A method of fabricating a germanium photo detector comprising:
preparing a silicon substrate;
implanting ions in the silicon substrate to from a N+ layer for a bottom electrode of a photodiode;
depositing and planarizing a silicon oxide layer;
forming contact holes in the silicon oxide layer which communicate with the underlying N+ layer;
growing an epitaxial N+ germanium layer on the silicon oxide layer and in the contact holes;
growing an intrinsic germanium layer on the epitaxial germanium layer and any exposed silicon oxide layer;
growing a P+ germanium layer on the intrinsic germanium layer and any exposed silicon oxide layer;
depositing a layer of covering material take from the group of materials consisting of polysilicon, polysilicon-germanium and $In_2O_3$—$SnO_2$; and
etching the covering material to form individual sensing elements.

8. The method of claim 7 which includes forming contact holes of diameter "D" and wherein said growing an epitaxial N+ germanium layer on the silicon oxide layer and in the contact holes includes growing an epitaxial germanium layer to a thickness "H", wherein the h:D ration is between about 0.5 and 5.

9. The method of claim 7 wherein said growing an intrinsic germanium layer on the epitaxial germanium layer and any exposed silicon oxide layer includes growing intrinsic germanium to a thickness of between about 100 nm to 2000 nm, and wherein the distance between the contact holes is more than twice the thickness of the intrinsic germanium layer.

10. The method of claim 7 which further includes, after said growing a germanium layer of a second type on the intrinsic germanium layer and any exposed silicon oxide layer, depositing a layer of silicon nitride; depositing a layer of silicon oxide on the silicon nitride; polishing the structure to remove the silicon oxide, stopping at the level of the silicon nitride; and etching to remove the silicon nitride.

11. A method of fabricating a germanium photo detector comprising:
preparing a silicon substrate;
depositing and planarizing a silicon oxide layer;
forming contact holes in the silicon oxide layer which communicate with the underlying silicon substrate;
growing an epitaxial N+ germanium layer on the silicon oxide layer and in the contact holes; wherein said forming contact holes includes forming contact holes of diameter "D" and wherein said growing an epitaxial N+ germanium layer on the silicon oxide layer and in the contact holes includes growing an epitaxial N+ germanium layer to a thickness "H", wherein the h:D ration is between about 0.5 and 5;
growing an intrinsic germanium layer on the epitaxial germanium layer and any exposed silicon oxide layer;
growing a P+ germanium layer on the intrinsic germanium layer and any exposed silicon oxide layer;
depositing a layer of covering material take from the group of materials consisting of polysilicon, polysilicon-germanium and $In_2O_3$—$SnO_2$; and
etching the covering material to form individual sensing elements.

12. The method of claim 11 which includes, after said preparing a silicon substrate; performing any CMOS process steps, including, implanting ions in the silicon substrate to from a N+ layer for a bottom electrode of a photodiode; and wherein said forming contact holes in the silicon oxide layer which communicate with the underlying silicon substrate includes forming contact holes which communicate with the N+ layer.

13. The method of claim 11 wherein said growing an intrinsic germanium layer on the epitaxial germanium layer and any exposed silicon oxide layer includes growing intrinsic germanium to a thickness of between about 100 nm to 2000 nm, and wherein the distance between the contact holes is more than twice the thickness of the intrinsic germanium layer.

14. The method of claim 11 which further includes, after said growing a germanium layer of a second type on the intrinsic germanium layer and any exposed silicon oxide layer, depositing a layer of silicon nitride; depositing a layer of silicon oxide on the silicon nitride; polishing the structure to remove the silicon oxide, stopping at the level of the silicon nitride; and etching to remove the silicon nitride.

* * * * *